(12) United States Patent
Abe et al.

(10) Patent No.: US 6,731,561 B2
(45) Date of Patent: May 4, 2004

(54) SEMICONDUCTOR MEMORY AND METHOD OF TESTING SEMICONDUCTOR MEMORY

(75) Inventors: Mitsuhiro Abe, Kanagawa-ken (JP); Kenta Kaneeda, Kanagawa-ken (JP); Hiroo Ota, Kanagawa-ken (JP); Hideo Niki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 10/100,269

(22) Filed: Mar. 15, 2002

(65) Prior Publication Data

US 2002/0176306 A1 Nov. 28, 2002

(30) Foreign Application Priority Data

Mar. 27, 2001 (JP) ...................... P2001-091296

(51) Int. Cl.$^7$ ................................. G11C 7/00
(52) U.S. Cl. ........................ 365/226; 365/201; 714/14
(58) Field of Search ................ 365/226, 201; 714/14

(56) References Cited

U.S. PATENT DOCUMENTS 6,434,065 B1 * 8/2002 Kobayashi et al. ......... 365/200
6,529,438 B1 * 3/2003 Suzuki et al. ........... 365/230.06
6,635,934 B2 * 10/2003 Hidaka ....................... 257/369

FOREIGN PATENT DOCUMENTS

| JP | 404290975 | * 10/1992 | ........... G01R/31/28 |
| JP | 2002245796 | * 8/2002 | ........... G11C/29/00 |

OTHER PUBLICATIONS

U.S. patent application No. 09/722,195 filed Nov. 22, 2000.

* cited by examiner

Primary Examiner—Viet Q. Nguyen
(74) Attorney, Agent, or Firm—Hogan & Hartson LLP

(57) ABSTRACT

A semiconductor memory includes a group of memory cells arrayed in a matrix, memory cell electric power source lines configured to connect the respective memory cells arrayed in a direction of rows of the group of memory cells of each of the rows, two electric power source terminals configured to be mutually independent, and switches configured to be connected between the memory cell electric power source lines and the two electric power source terminals respectively, to be controlled to turn ON/OFF by a inversion logic operation based on a test mode switching signal for switching to and from a test mode and a normal operation mode, and to connect the memory cell power source line to either of the two electric power source terminals according to the ON/OFF control.

3 Claims, 7 Drawing Sheets

SEMICONDUCTOR MEMORY AND METHOD OF TESTING SEMICONDUCTOR MEMORY

CROSS REFERENCE TO RELATED APPLICATIONS

This application claims benefit of priority under 35 USC §119 to Japanese Patent Application No. 2001-091296 filed on Mar. 27, 2001, the entire contents of which are incorporated by reference herein.

BACKGROUND OF THE INVENTION

1. Field of the Invention

The present invention relates to a semiconductor memory such as a static random access memory, and more particularly relates to a semiconductor memory implemented with a test circuit and a method of testing a semiconductor memory.

2. Description of Related Art

In recent years, the increases in the storage capacity and improvements in the power saving structure on the standby mode of semiconductor memories such as the static random access memory have been advanced. The frequency of occurrence of defective bit locations tends to increase as the storage capacity increases, so that, in the test process, defective memory cells are replaced by redundancy memory cells in accordance with the redundancy circuitry technique in order to relieve malfunctions resulting from defective bits.

It is sometimes the case, however, that there is a memory cell(s) through which current leakage exceeding an allowable value passes, while the static random access memory including the defective memory cell can be normally operated without a problematic function. If there is such a memory cell, however, the consumption current of the standby mode increases.

Therefore, the semiconductor memory including a test circuit which tests to detect the location of a memory cell through which a leakage current is flowing has been proposed. Then, a laser fuse connecting the detected memory cell and electric power source terminals is fused and disconnected in order to interrupt the leakage current path, then the defective memory is replaced by a redundancy cell.

However, the conventional semiconductor memory including the test circuit has the following problem.

When measuring a leakage current value, a long time is needed in order to set the initial value to a desired value of static memory cell data in particular in a static memory cell consisting of flip-flop. As a result, in the case of recent semiconductor memories of large capacity, there is the problem that test time becomes enormous.

SUMMARY OF THE INVENTION

A semiconductor memory in one embodiment according to the present invention includes a group of memory cells arrayed in a matrix, memory cell electric power source lines configured to connect the respective memory cells arrayed in a direction of rows of the group of memory cells of each of the rows, two electric power source terminals configured to be mutually independent, and switches configured to be connected between the memory cell electric power source lines and the two electric power source terminals respectively, to be controlled to turn ON/OFF by a inversion logic operation based on a test mode switching signal for switching to and from a test mode and a normal operation mode, and to connect the memory cell power source line to either of the two electric power source terminals according to the ON/OFF control.

In addition, a semiconductor memory in another embodiment according to the present invention includes a memory cell array in which memory cells are arrayed in a matrix, a plurality of word lines provided within the memory cell array, each of the word lines connected to a same number of the memory cells in a row direction, a word line selection circuit including an input terminal connected to a row selection line for selecting a row and configured to select a predetermined word line among from the plurality of word lines, a plurality of memory cell electric power source lines arrayed in the row direction of the memory cell array, a row decoder configured to output a selection signal for selecting the row selection line based on a row addressing signal, first and second electric power source terminals configured to be mutually independent, and electric power source switching circuits respectively provided to either end of the memory cell electric power source lines and configured to supply electric power from the first electric power source terminal to the memory cells of the rows to be tested and to supply electric power from the second electric power source terminal to the memory cells except the memory cells of the rows to be tested in the test mode.

Furthermore, a method of testing a semiconductor memory in one embodiment according to the present invention includes, sequentially selecting memory cell electric power source lines of rows to be tested from a plurality of memory cell electric power source lines arrayed in the row direction of a memory cell array in which memory cells are arrayed in a matrix, supplying leak testing electric power from a first electric power source terminal to the memory cells of the selected rows to be tested and supplying electric power from a second electric power line to the memory cells of the rows except the rows to be tested, and measuring a leakage current value of the rows to be tested in order to detect a row including a memory cell where the leakage current is occurring.

DETAILED DESCRIPTION

Various embodiments of the present invention will be described with reference to the accompanying drawings.

COMPARATIVE EXAMPLE

Figure 1:
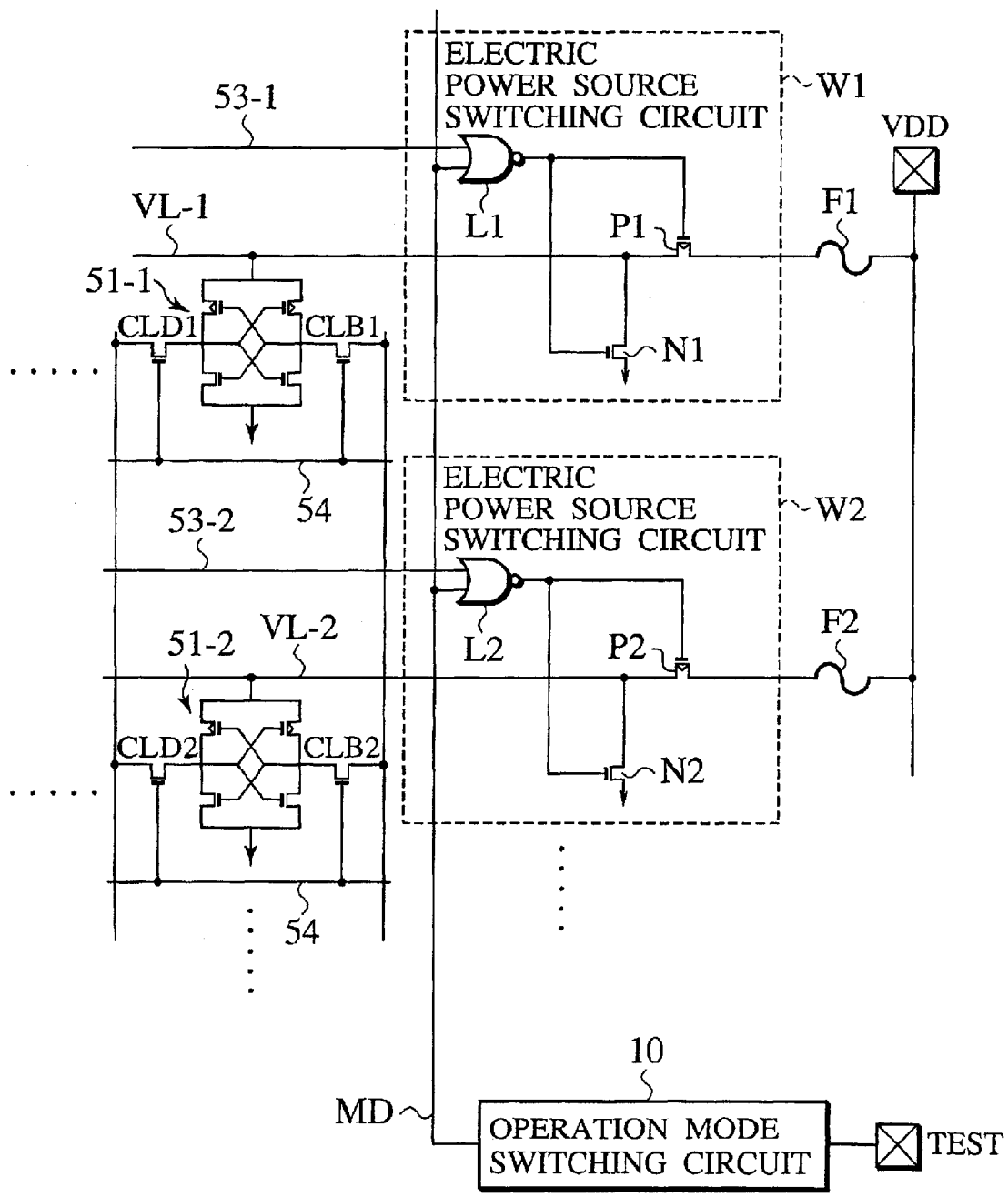
FIG. 1 is a block diagram showing the major elements of a semiconductor memory implemented with a test circuit according to a comparative example.

FIG. 1 is a block diagram showing the major elements of a semiconductor memory implemented with a test circuit according to a comparative example.

Memory cells 51-1, 51-2, . . . are some of memory cells arranged in a matrix in a memory cell array, which are connected to bit line pairs in FIG. 1.

The memory cells 51-1, 51-2, . . . are supplied with electric power from an electric power source through respective memory cell power source lines VL-1, VL-2, . . . wired in a row direction. These memory cell electric power source lines VL-1, VL-2, . . . are connected with electric power source switching circuits W1, W2, respectively in the same circuit configuration.

In the electric power source switching circuit W1, for example, one end of a pMOS transistor P1 and one end of an nMOS transistor N1 are connected to a memory cell electric power source line VL-1. The other end of the pMOS transistor P1 is connected to an electric power source terminal VDD via a fuse element F1. The other end of the nMOS transistor N1 is grounded. Gates of the p-type and nMOS transistors P1 and N1 are inputted with an output of a NOR circuit L1. One of two input terminals of the NOR circuit L1 is connected with a mode signal MD, which is an output of an operation mode switching circuit 10 and the other input terminal of the NOR circuit L1 is connected with a row selection line 53-1.

The operation mode switching circuit 10 is configured to be externally given an operation mode switching signal TEST to a input terminal via the terminal TEST, and to output the mode switching signal MD. The operation mode switching signal TEST is used to indicate the operation mode switching between a normal operation mode and a test mode.

In the normal operation mode, the memory cells 51 can be selected by selecting the row selection lines 53-1, 53-2, . . . in accordance with a desired address signal as externally given in order to activate a desired one of the word lines 54 connected to the selected row selection lines 53-1, 53-2, . . . . When the semiconductor memory is in standby mode, all of the word lines 54 are deactivated under the control of an internal circuit in response to an external signal as input.

In the leak test mode, the memory cell through which a leakage current flows is detected by selecting the row selection lines 53. When a signal is given to the terminal TEST at an "H" level, the mode switching signal MD as output from the operation mode switching circuit 10 is pulled down to a "L" level. Also, by the address signal as externally given, for example the row selection line 53-1 connected to the electric power source switching circuit W1 is pulled up to the "H" level.

The output signal of the NOR gate circuit L1 receiving these signals is pulled down to the "L" level, so that the pMOS transistor P1 is made conductive while the nMOS transistor is made non-conductive. By this configuration, the memory cell electric power source line VL-1 and the electric power source VDD are connected to each other in order to supply electric power to the memory cell 51-1.

At this time, all the remaining row selection lines 53-2, . . . are pulled down to the "L" level, so that all the electric power source switching circuits W2, connected to these row selection lines are suited to deactivated states. As for the electric power source switching circuit W2, an output of a NOR circuit L2 is pulled up to the "H" level and, as a result, a pMOS transistor P2 is made non-conductive and an nMOS transistor N2 is made conductive. This causes the memory cell electric power source line VL-2 and the electric power source VDD to be shut off from each other, so that the memory cell 51-2 is not supplied with any current.

In such a manner, the respective rows are sequentially selected, and leakage current is measured for each selection in such a manner that, if a leakage current occurs in any memory cell, a current path is formed from the cell electric power source terminal VDD to the ground terminal of this memory cell, which enables the detection of the leakage current. If this leakage current exceeds an allowable value, its relevant selection row includes a defective memory cell.

By fusing the fuse element of the selection row, the memory cell electric power source line and the electric power source can be shut off from each other to disconnect the leak path, the selection row then being replaced with a redundancy row prepared in advance.

By thus testing a semiconductor memory, it is possible to detect the location of a memory cell through which leakage current is flowing.

In the semiconductor memory of this comparative example, however, there is the following problem.

When leakage current is measured, significant time is required in order to set the initial value of the memory cell data to a desired value, especially in static memory composed of flip-flops, resulting in enormous testing time for recent large-capacity semiconductor memories.

When a test for leak detection of a memory cell is carried out, first m×n cells arrayed in a matrix are set to initial values of "1" or "0" (initial write) as cell data. This is done by ordinary writing operation. For example, in the case of 1M [word]×16 [bit]=16M-bit static RAM, the time T required for writing the initial values is estimated as follows.

Assuming that a cycle time=150 [ns], the number of cells/word line=256, and the number of columns/word line= 16, to write both "1" and "0" to all the cells, the following time is required:

$$T=150[ns]\times 2\times (16777216/256)\times 16=314[ms].$$

In the leak test of a semiconductor memory after the cells are set to desired initial values and the respective rows are selected sequentially to be measured for leakage current value. However, when the first row is selected and tested, the initial values originally set to the memory cells of the other non-selected rows are erased. That is, in an example shown in FIG. 1, when a row where the memory cells 51-1, . . . are arranged is tested for leak detection, the transistor N2 of the electric power source switching circuit W2 of the next row is turned ON, so that when the memory cells 51-2, . . . of this row are tested for leak detection, their cell data (initial value) is not held, so that it is necessary to write the initial value again in these memory cells 51-2, . . . before they can be tested for leak detection.

As the density of semiconductor memories increases and the amount of leak testing time increases, it is necessary to write an initial value of, for example, the above-mentioned time of 314 [ms] for each of N testing times, thus resulting in enormous testing time.

[First Embodiment]

Figure 2:
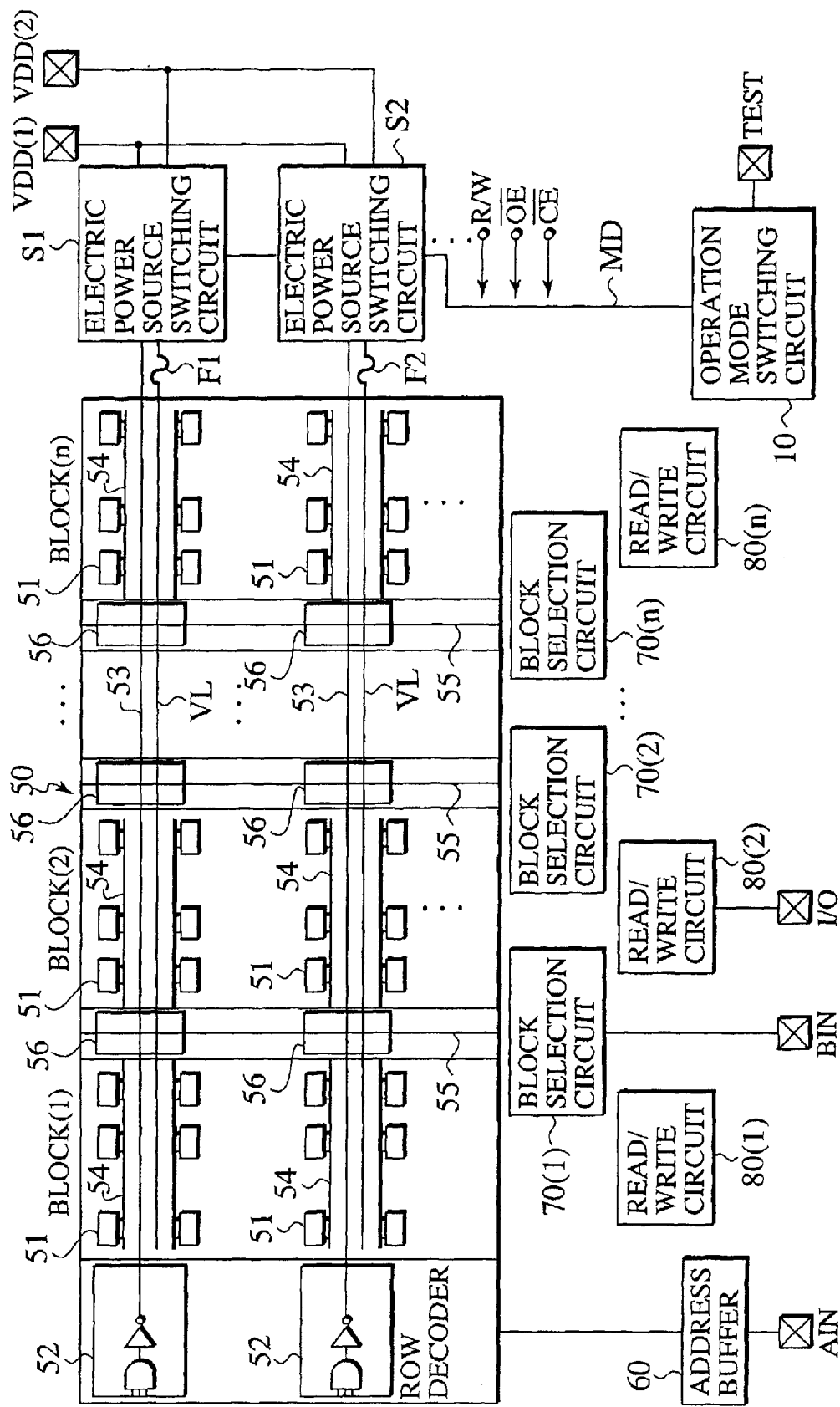
FIG. 2 is a block diagram showing a semiconductor memory according to a first embodiment.
Figure 3:
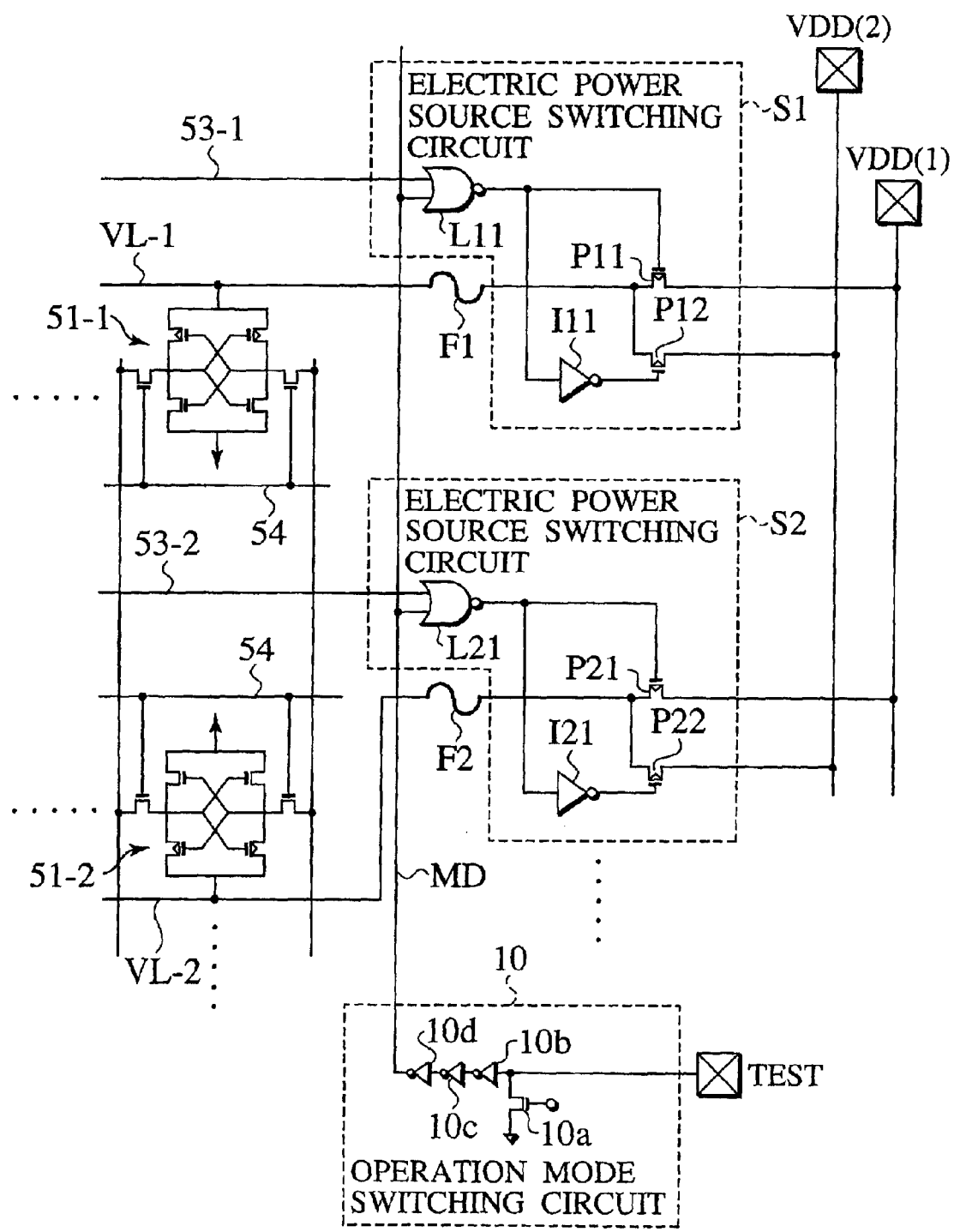
FIG. 3 is a circuit diagram showing the major elements of the semiconductor memory as illustrated in FIG. 2.

FIG. 2 is a block diagram showing a configuration of a semiconductor memory according to the first embodiment and FIG. 3 is a specific circuit diagram of an important part of the configuration of FIG. 2. The elements common to FIG. 1 and these figures are indicated by the same reference numerals and their detailed explanation will be omitted.

As shown in FIG. 2, this semiconductor memory is composed of a static RAM and configured so that a memory cell array 50 including memory cells 51 arrayed in a matrix are divided into a plurality of blocks (1) to (n).

The semiconductor memory includes control terminals (a read/write signal R/W, an output enable signal/OE, a chip enable signal/CE), an internal circuit provided for the control terminals, address terminals for selecting an address (an AIN terminal, a BIN terminal), an internal circuit provided for the address terminals (row decoders 52, block selection circuits 70(1) to 70(n) and so forth), I/O terminals for writing and reading data, internal circuits provided for the I/O terminals (read/write circuits 80(1) to 80(n)), and electric power source switching circuits S1, S2, . . . .

The plurality of row decoders 52 is located at one end of memory cell arrays 50. A main row selection line 53 is extended from each row decoder 52. The row decoder 52 serves to activate a desired the main row selection line 53 in accordance with the row addressing signal AIN which is input through an address buffer 60. Block selection lines 55 are extended from each of block selection circuits 70 to a plurality of block ends, and word line selection circuits 56 receiving input signals from the row selection lines 53 and the block selection lines 55 are located at one end of the blocks.

Also, each pair of the memory cells 51 are located symmetrically in a vertical direction and are supplied with the electric power source through two memory cell electric power source lines VL-1 and VL-2 which are located in parallel with the row selection lines 53.

In a normal operation mode, the memory cells 51 can be selected by selecting one of a plurality of the row selection lines 53 and one of a plurality of the block selection lines 55 in accordance with a desired address AIN and a desired address BIN in order to activate a desired one of word lines 54 by means of one of the word line selection circuits 56 connected to the selected row selection line 53 and the selected block selection line 55. Data as selected can be read from the memory cells 51 by means of the read/write circuit 80 and output through the I/O terminal while desired data can be written to the memory cells 51 by means of the read/write circuit 80 through the I/O terminal.

When the semiconductor memory is in standby mode, all of the word lines 54 are deactivated under the control of an internal circuit in response to an external signal as input.

The memory cells 51 are arrayed in an n-by-n matrix. Only the memory cells 51-1, . . . of the first row and the memory cells 51-2, . . . of the second row are shown in FIG. 3 for simplicity of explanation.

Those memory cells 51-1, . . . and 51-2, . . . are supplied with electric power through memory cell electric power source lines VL-1, VL-2, . . . respectively. Electric power source switching circuits S1, S2, . . . of the same circuit configuration are respectively connected to one end of these memory cell electric power source lines VL-1, VL-2, . . . via fuse elements F1, F2, The electric power source switching circuit S1 comprises, for example pMOS transistors P12 and P12, a NOR circuit L11, and an inverter circuit I11. An output of the NOR circuit L11 is inputted to a gate of the pMOS transistor P11 and an input terminal of the inverter circuit I11. An output terminal of the inverter circuit I11 is connected to a gate of the pMOS transistor P12. Further, one end of the pMOS transistor P11 is connected with the cell electric power source terminal VDD(1). Also, one end of the pMOS transistor P12 is connected with the cell electric power source terminal VDD(2). The other end of the pMOS transistors P11 and P12 are commonly connected to one end of the memory cell electric power source line VL-1 via the fuse element F1. One input terminal of the NOR circuit L11 is connected with a mode signal MD output from an operation mode switching circuit 10, and the other input terminal thereof is connected with the row selection line 53-1.

Likewise, the electric power source switching circuit S2 also includes pMOS transistors P21 and P22, a NOR circuit L21, and an inverter I21 and is connected to the memory cell electric power source line VL-2 via a fuse F2, the row selection line 53-2, the mode signal MD, and the cell electric power source terminals VDD(1) and VDD(2).

The operation mode switching circuit 10 includes a pull-down element 10a and inverters 10b, 10c and 10d. The operation mode switching circuit 10 is configured to be externally given an operation mode switching signal TEST to a input terminal via the terminal TEST, and to output the mode switching signal MD. The operation mode switching signal TEST is used to indicate operation mode switching between a normal operation mode and a test mode.

Figure 4:
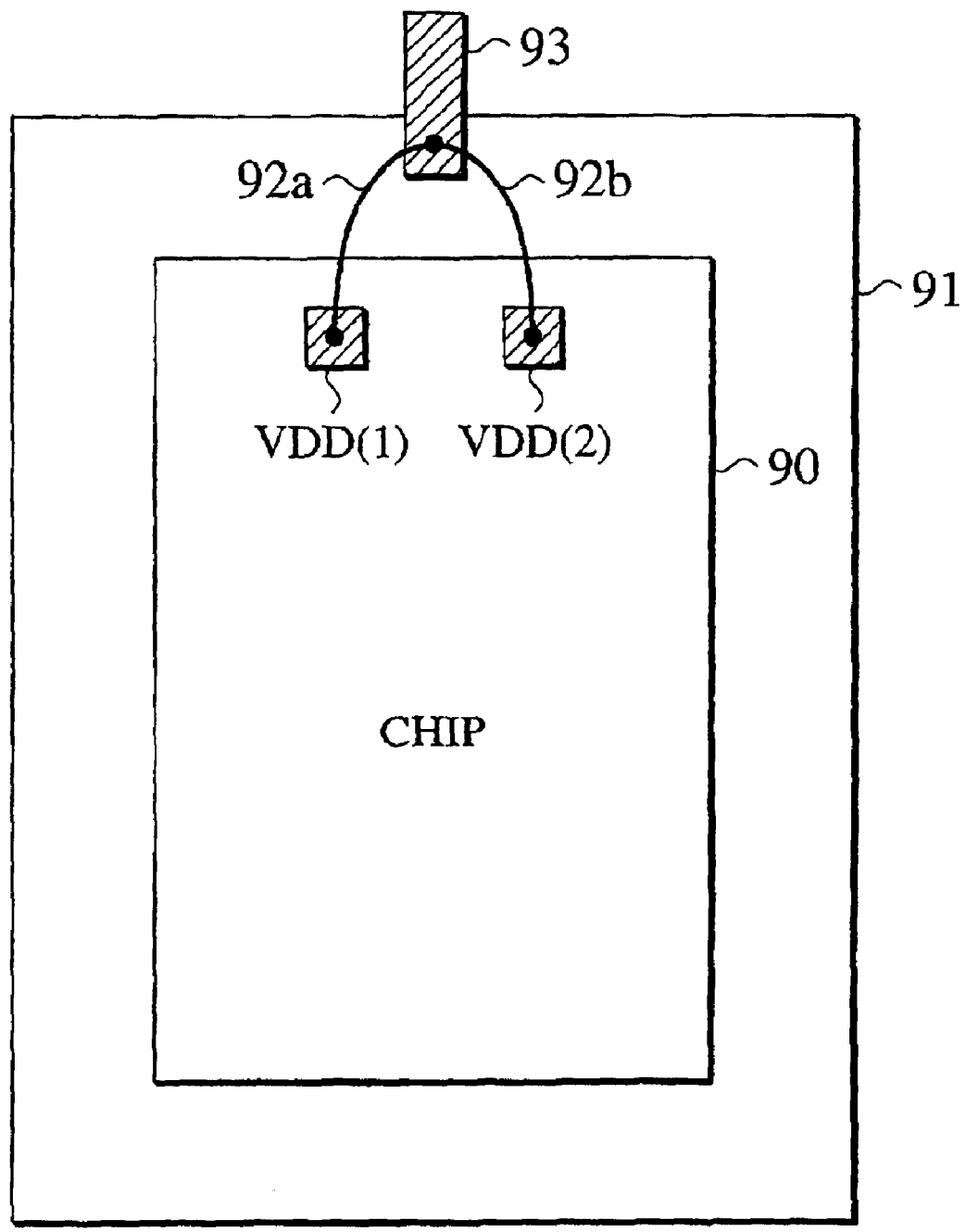
FIG. 4 is a plan view of finished product of a chip, specifically showing electric power supply current paths to cell electric power source terminals VDD (1) and VDD (2) according to the first embodiment.

FIG. 4 is a plan view of a finished chip, specifically showing electric power supply paths to these cell electric power source terminals VDD(1) and VDD(2).

A chip 90 merging the semiconductor memory of the first embodiment is mold-packaged with resin 91.

The two cell electric power source terminals VDD(1) and VDD(2) are both connected through respective electric power source lines 92a and 92b to an external electric power source terminal 93 to which external power source is applied. The cell electric power source terminal VDD(1) serves to supply electric power through a memory cell electric power source line VL to each of the memory cells 51 in a normal operation mode and serves to supply leak testing electric power to memory cells to be tested for leak detecting in a test mode.

The cell electric power source terminal VDD(2) serves to supply electric power to internal circuits except the memory cell array 50 in a normal operation mode and serves to supply electric power to the internal circuits as well as to the memory cells except the memory cells to be tested for a leak in a test mode.

Next, the operations (A) and (B) of the semiconductor memory cell unit of the first embodiment will be explained.

(A) The Operation of the Leak Test Mode:

In leak testing, any memory cell 51 where a leakage current occurs is detected when the row selection line 53 is selected.

First, in an ordinary writing operation, initial writing is performed whereby an initial value of "1" or "0" is set as cell data to n×n number of the memory cells 51 arrayed in a matrix. Upon completion of this initial writing, the mode signal MD is turned "L" and the row selection lines 53 are sequentially activated to sequentially select the rows, thereby measuring the value of a leakage current.

That is, when the TEST terminal is applied with the "H" level from the outside of the device, the mode signal MD output from the operation mode switching circuit 10 is pulled down to the "L" level. Also, a desired row decoder 52 is activated by an address signal AIN input externally, so that a row selection line 53 connected thereto is pulled up to the "H" level.

It is assumed that, for example, the first row selection line 53-1 is pulled up to the "H" level so that the memory cells 51-1, . . . are selected. As a result, the output of the NOR circuit L11 of the electric power source switching circuit S1 is pulled down to the "L" level so that the pMOS transistor P11 is turned ON and electric power is supplied from the cell electric power supply terminal VDD(1) through the memory cell electric power source line VL-1 to the memory cells 51-1, . . . . Also, the pMOS transistor P12 is turned OFF to thereby disconnect the cell electric power source terminal VDD (2) and the memory cell electric power source line VL-1 from each other.

At this time, all the other row selection lines, i.e. the non-selected row selection lines 53-2, . . . are pulled down to the "L" level, so that, for example, the electric power source switching circuit S2 for the second row is pulled up to the "H" level, the pMOS transistor P21 is turned OFF, and the cell electric power source terminal VDD(1) becomes non-conductive, thus having no influence on the leak test of the first row. Also, the pMOS transistor P22 is turned ON and the memory cell electric power source line VL-2 and the cell electric power source terminal VDD(2) are made conductive to each other. Therefore, the initial values written in the memory cells 51-2, . . . are held without being destroyed.

Figure 5:
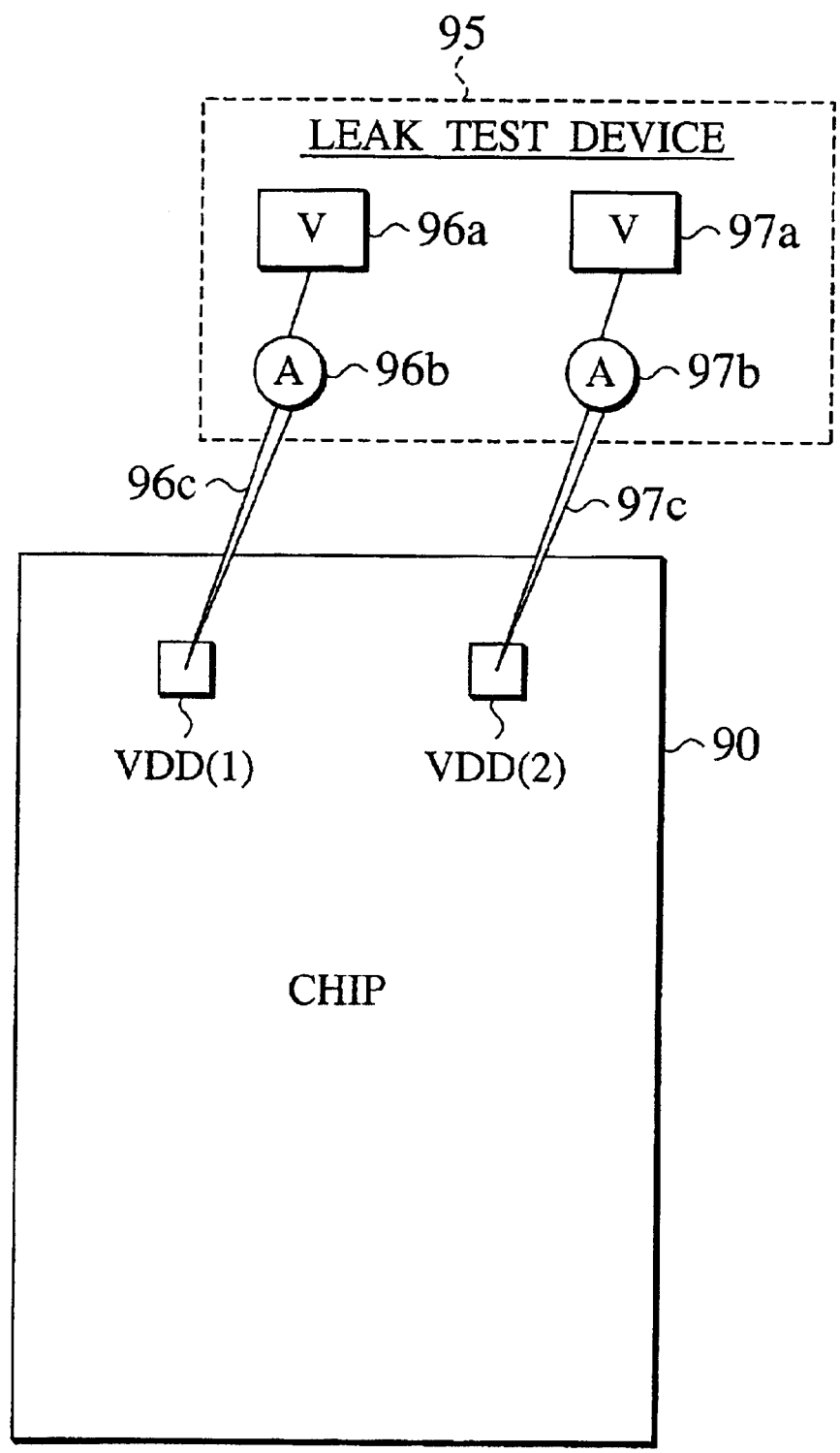
FIG. 5 is a conceptual illustration showing the relation between the chip and a leak test device according to the first embodiment.

FIG. 5 is a conceptual diagram for showing the situation at the time of leak testing. As shown in FIG. 5, a leak test device 95 includes electric power source sections 96a and 97a, ammeters 96b and 97b, and probe needles 96C and 97C arranged correspondingly. In leak testing, the probe needles 96C and 97C are brought into contact with the cell electric power source terminals VDD(1) and VDD(2) of the chip 90 respectively, to set the semiconductor memory (chip) 90 in the leak test mode as mentioned above, thereby conducting the leak test.

When a leakage current is detected, a leak path from the cell electric power source terminal VDD(1) exists and the value of the leakage current is indicated on the ammeter 96b. If this measured value exceeds an allowable value, a selected row includes a defective memory cell. Then, the fuse for this row (e.g., F1) is melted to thereby shut off the leak path and then this row is replaced with a redundancy row prepared in advance.

The location of the memory cell as a leakage current path can be detected in this manner.

In the first embodiment, for example, as a control method of leak testing, determination of a defective cell is performed by determining, as a region with a leakage current flowing at no smaller than a predetermined value, one of a first large region and a remaining second large region, either of the first and second large regions being selected by simultaneously selecting a predetermined number of row selection lines. Next, in either of the first or second large regions, first and second small regions are obtained by selecting a predetermined numbers of row simultaneously selection lines again, and one of these first and second small regions, as a region with a leakage current flowing at no smaller than a predetermined value, is identified. These steps can be repeated to finally identify a row selection line having a leakage current at no smaller than the predetermined value.

(B) The Operation of the Normal Operation Mode:

In the normal operation mode, an signal is not externally given to the terminal TEST, so that the "H" level is given to the gate terminal of the pull-down element 10a connected to the input terminal of the operation switching circuit 10, then the pull-down element 10a is made conductive and outputs the mode switching signal MD at the "H" level. The output signals of the NOR gate circuits L11, L12, . . . of all the electric power source switching circuit S1, S2, . . . receiving the mode switching signal MD are pulled down to the "L" level, so that the pMOS transistors P11, P21, . . . are made conductive while the nMOS transistors 12, 22, . . . are made non-conductive.

By this configuration, all of the memory cell electric power source lines VL-1, VL-2, . . . and the cell electric power source terminal VDD(1) are connected to each other in order to supply electric power to all the memory cells 51 and enable the operation of the semiconductor memory.

Thus, according to the first embodiment, during leak testing, the cell data (initial value) in the non-selected rows is held without being destroyed, thus enabling leak testing of all the rows by performing only the first initial writing. This feature enables the time required for initial writing and hence the test time to be significantly shortened.

It is assumed that it is necessary to conduct a leak test 36 times, in particular, when the above-mentioned testing method of narrowing down from the large region to the small region in search for a leak portion is employed. If it takes the above-mentioned time of 314 [ms] to perform each initial writing, it takes 314 [ms]×1=314 [ms] in contrast to 314 [ms]×36=11.33 seconds by the comparative example to perform all the initial writing operations.

[Second Embodiment]

Figure 6:
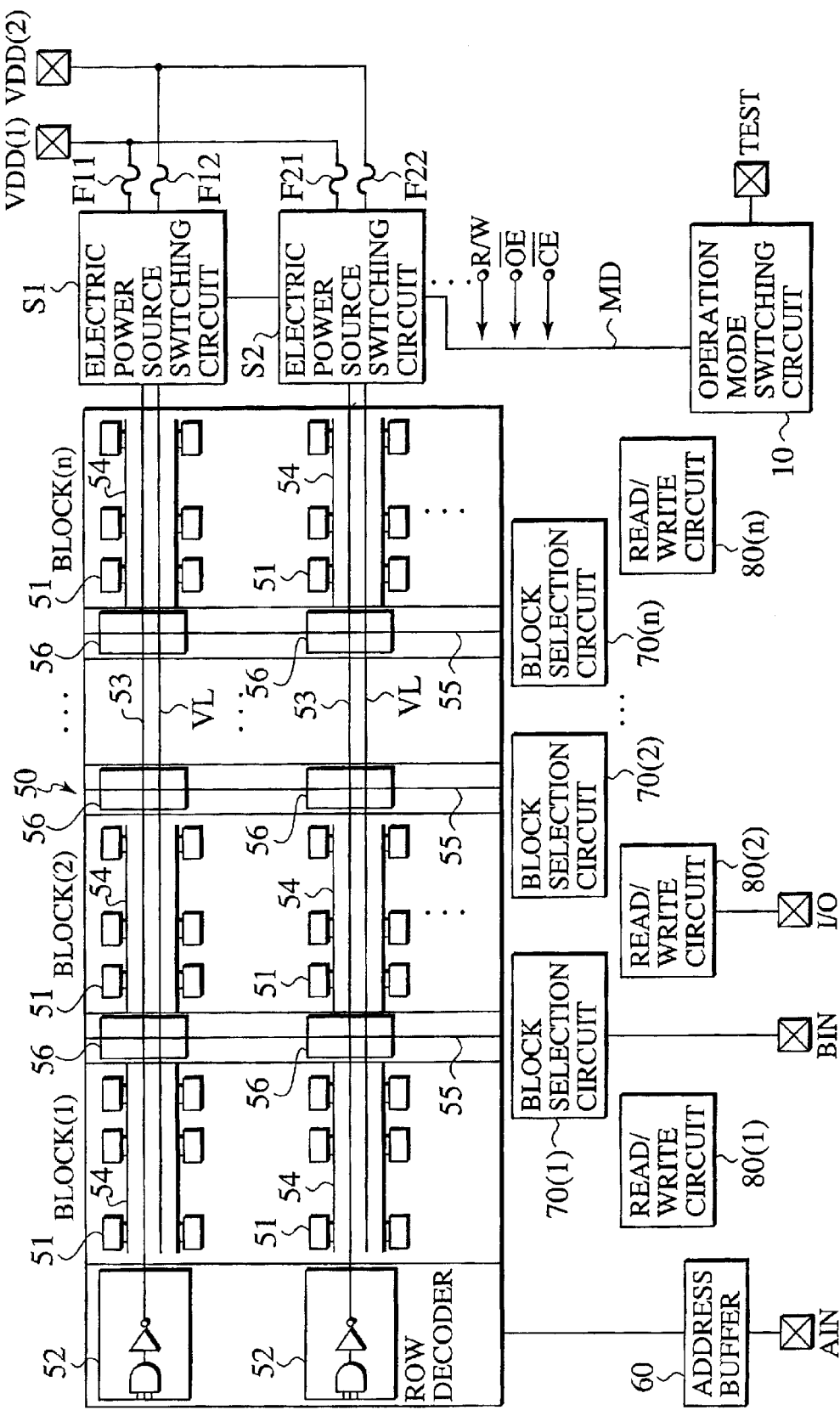
FIG. 6 is a block diagram showing a semiconductor memory according to a second embodiment.
Figure 7:
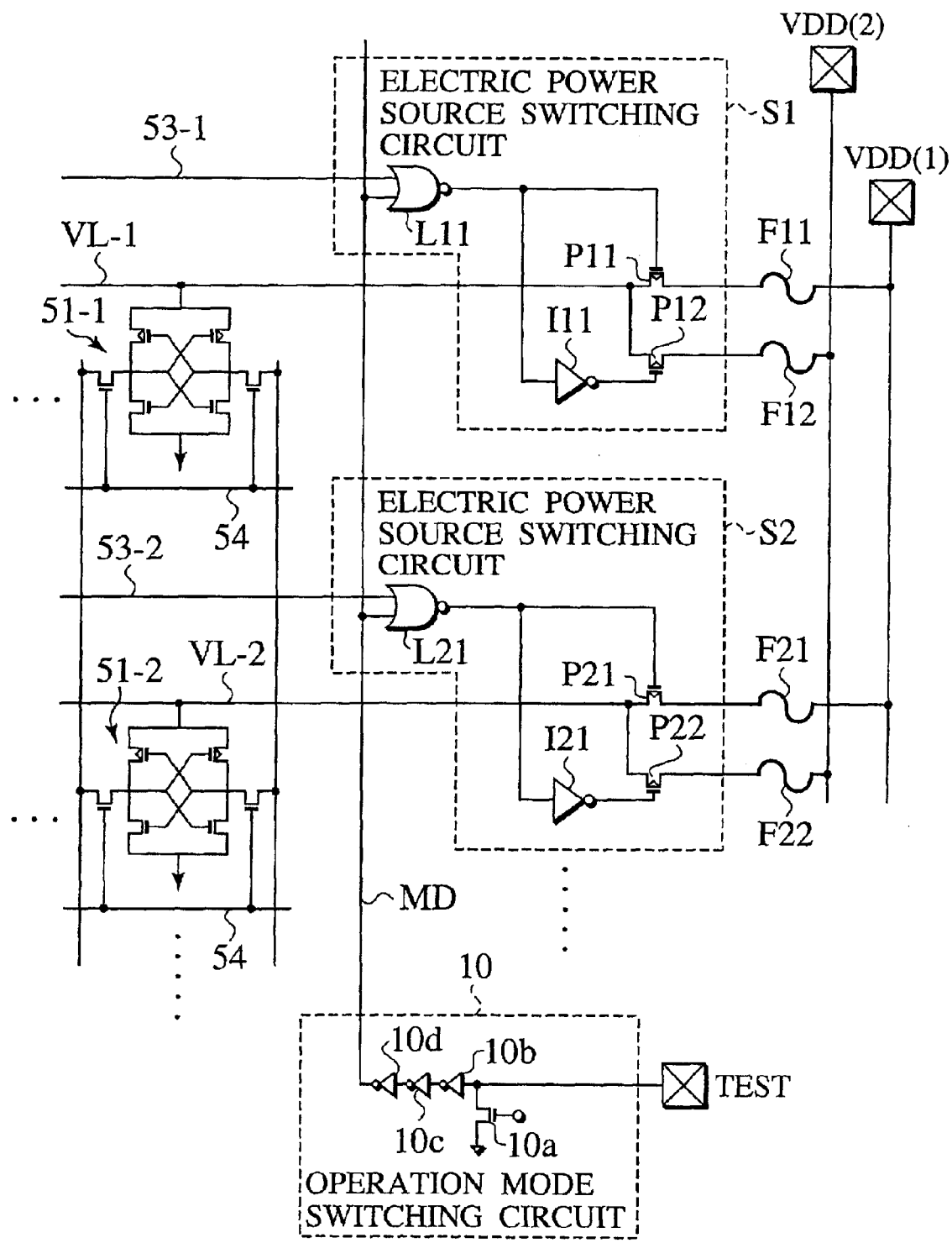
FIG. 7 is a circuit diagram showing the major elements of the semiconductor memory as illustrated in FIG. 6.

FIG. 6 is a block diagram for showing a configuration of a semiconductor memory according to the second embodiment and FIG. 7 is a circuit diagram of an important part of the configuration of FIG. 6. The elements common to FIG. 2 and FIG. 3 are indicated by the same reference numerals and their detailed explanation will be omitted.

In the first embodiment, the fuse elements F1, F2, . . . are connected between one end of the memory cell electric power source lines VL and the electric power source switching circuits S1, S2, . . . respectively. In contrast, in the second embodiment, the fuse elements F11, F12, F21, . . . are connected between the cell electric power source lines VDD(1) and VDD(2) and the electric power source switching circuits S1, S2, . . . respectively.

Specifically, the fuse elements F11 is connected between the pMOS transistors P11 and the cell electric power source terminal VDD(1), the fuse elements F12 is connected the pMOS transistors P12 and the cell electric power source terminal VDD(2). Likewise, the fuse elements F21 is connected between the pMOS transistors P21 and the cell electric power source terminal VDD(1), the fuse elements F22 is connected between the pMOS transistors P22 and the cell electric power source terminal VDD(2).

This configuration enables sufficient spacing between the fuse element and the memory cells, thus avoiding the memory cells from being affected by the melting of the fuse element as much as possible. Also, this second embodiment improves the degree of freedom in arrangement of the fuse elements as compared to the first embodiment, thus providing convenience in chip design.

As detailed above, the semiconductor memory according to any one of the first and second embodiments is capable of significantly shortening the test time of such a test mode as a leak test.

Although the embodiments of the present invention have been described in detail, the invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor memory comprising:
   a group of memory cells arrayed in a matrix;
   memory cell electric power source lines configured to connect the respective memory cells arrayed in a direction of rows of the group of memory cells of each of the rows;

two electric power source terminals configured to be mutually independent; and electric power source switching circuits configured to be connected between the respective memory cell electric power source lines and the two electric power source terminals respectively, to be controlled to turn ON/OFF by an inversion logic operation based on a test mode switching signal for switching to and from a test mode and a normal operation mode, and to connect the respective memory cell electric power source lines to either of the two electric power source terminals according to the ON/OFF control.

2. The semiconductor memory according to claim 1, wherein the two electric power source terminals are both configured to be connectable to an external electric power source terminal to which external electric power is applied.

3. The semiconductor memory according to claim 2, wherein:

one of the two electric power source terminals is configured to supply electric power to the memory cells through the memory cell electric power source lines in the normal operation mode and to supply leak testing electric power to the memory cells to be tested for leak in the test mode; and the other of the two electric power source terminals is configured to supply electric power to an internal circuit except the memory cell group in the normal operation mode and to supply electric power to the internal circuit as well as to the memory cells except the memory cells to be tested for leak in the test mode.

* * * * *